United States Patent [19]

Mukai

[11] Patent Number: 4,800,179
[45] Date of Patent: Jan. 24, 1989

[54] METHOD FOR FABRICATING SEMICONDUCTOR DEVICE

[75] Inventor: Ryoichi Mukai, Kawasaki, Japan
[73] Assignee: Fujitsu Limited, Kawasaki, Japan
[21] Appl. No.: 60,923
[22] Filed: Jun. 12, 1987
[30] Foreign Application Priority Data Jun. 13, 1986 [JP] Japan ................. 61-137509

[51] Int. Cl.$^4$ ............ H01L 21/04; H01L 21/00
[52] U.S. Cl. ..................... 437/203; 437/173;
437/194; 437/195; 437/249; 148/DIG. 93;
427/43.1; 427/53.1; 219/121.73
[58] Field of Search ........... 427/53.1, 54.1, 43.1,
427/88, 89; 29/590, 591, 576 B; 357/65, 71;
437/173, 194, 195, 249; 148/DIG. 93

[56] References Cited

U.S. PATENT DOCUMENTS

| | | | |
|---|---|---|---|
| 4,214,918 | 7/1980 | Gat et al. | 357/91 |
| 4,258,078 | 3/1981 | Celler et al. | 427/53.1 |
| 4,388,517 | 6/1983 | Schulte et al. | 427/53.1 |
| 4,448,636 | 5/1984 | Baber | 427/53.1 |
| 4,465,716 | 8/1984 | Baber et al. | 427/53.1 |
| 4,495,218 | 1/1985 | Azuma et al. | 427/53.1 |
| 4,508,749 | 3/1985 | Brannon et al. | 427/43.1 |
| 4,657,778 | 3/1987 | Moran | 427/98 |
| 4,673,592 | 6/1987 | Porter | 427/88 |
| 4,674,176 | 6/1987 | Tuckerman | 357/71 |
| 4,681,795 | 7/1987 | Tuckerman | 427/53.1 |

OTHER PUBLICATIONS

David B. Tuckerman et al., "Laser Planarization", Solid State Technology, pp. 129–134, vol. 29, No. 4, Apr. 1986, Port Washington, New York.
Joseph C. Logue et al., "Techniques for Improving Engineering Productivity of VLSI Designs", IBM Journal of Research & Development, pp. 107–115, vol. 25, No. 3, May 1981, Armonk, New York.
P. W. Cook et al., "Connections and Disconnections on Integrated Circuits Using Nanosecond Laser Pulses", Applied Physics Letters, pp. 124–126, vol. 26, No. 3, Feb. 1975, New York.
T. McGrath, "Application of Excimer Lasers in Microelectronics", Solid State Technology, pp. 165–169, vol. 26, No. 12, Dec. 1983, Washington, New York.

Primary Examiner—Brian E. Hearn
Assistant Examiner—Beverly A. Pawlikowski
Attorney, Agent, or Firm—Staas & Halsey

[57] ABSTRACT

A method for fabricating a semiconductor device comprises forming a contact hole in an insulating film formed on a first wiring composed of an Al film, covering the insulating film with an Al film for a second wiring, applying laser beam pulses to the Al film for a second wiring from above, and patterning the Al film to form a second wiring.

6 Claims, 3 Drawing Sheets

METHOD FOR FABRICATING SEMICONDUCTOR DEVICE

BACKGROUND OF THE INVENTION

1. Field of the Invention

The present invention relates to a method for fabricating a semiconductor device. More particularly, the present invention relates to a method for fabricating a semiconductor device wherein a good ohmic contact can be obtained in a plurality of wiring layers composed of an Al film.

2. Description of the Related Art

The "Al film" as used herein refers to a film of aluminum or an aluminum alloy mainly composed of aluminum.

FIGS. 2a through 2c are sectional views illustrating the conventional method for fabricating a semiconductor device. As shown in FIG. 2a, an $SiO_2$ film 2 and an Al film 3 for a first wiring are formed on an Si substrate 1, and a second $SiO_2$ film 4 is formed as an interlaminar insulating film. A contact hole 5 is also formed.

By formation of the contact hole 5, the Al film 3 is exposed and an oxide formed by reaction with $O_2$ in air or an adsorbed material 6 is deposited on the exposed surface of the Al film 3. The presence of the oxide or adsorbed material 6 is an obstacle to formation of a good ohmic contact. Therefore, according to the conventional technique, as shown in FIG. 2b, the oxide or adsorbed material is removed by irradiation with Ar plasma before formation of an upper Al film.

As shown in FIG. 2c, an Al film 7 is formed by the sputtering method and a good ohmic contact is obtained between the Al film 3 and the Al film 7.

As pointed out above, according to the conventional method, the oxide or adsorbed material 6 on the Al film 3 is removed by irradiation with Ar plasma before formation of the Al film 7.

However, as according to the conventional method irradiation with an ion or radical is carried out, the surface of the Al film 3 is roughened and the $SiO_2$ film 4 is seriously damaged, resulting in formation of a defective element. Especially, in a high-density MOSLSI, since a gate $SiO_2$ film is broken by the discharge of the electrical charge accumulated, a short circuit is readily formed. Further, where the contact hole 5 has a very small diameter or a very large depth, it is difficult to satisfactorily remove the oxide or adsorbed material 6 due to the insufficient irradiation of the Ar plasma, or to obtain a good contact between the Al films 3 and 7 due to the insufficient penetration of Al into the hole. Therefore, the development of a means for overcoming these disadvantages is eagerly desired.

In "Laser Planarization", Solid State Technology, April 1986, it is disclosed that a metal conductor film, such as of gold, is planarized by irradiation of a dye laser beam. However, this article does not mention any measure for solving the above-mentioned problem.

SUMMARY OF THE INVENTION

The present invention has been completed to solve this problem of the conventional technique, and an object of the present invention is to provide a method for fabricating a semiconductor device, in which a good ohmic contact can be obtained in a plurality of wiring layers without damaging an element.

In accordance with the present invention, there is provided a method for fabricating a semiconductor device, which comprises forming a contact hole in an insulating film formed on a first wiring composed of an Al film, covering the insulating film with an Al film for a second wiring, applying laser beam pulses to the Al film for a second wiring from above, and patterning the Al film to form a second wiring.

DESCRIPTION OF THE PREFERRED EMBODIMENTS

The method for fabricating a semiconductor device according to the present invention is characterized by the steps of 1. forming a contact hole in an insulating film formed on a first wiring composed of an Al film, 2. covering the insulating film with an Al film for a second wiring, 3. applying laser beam pulses to the Al film for a second wiring from above, 4. and patterning the Al film to form a second wiring.

According to the present invention, after formation of the Al film for a second wiring, laser beam pulses are applied to the Al film from above, whereby the oxide or adsorbed material formed on the Al film for a first wiring is removed and a good ohmic contact is obtained between the Al film for a first wiring and the Al film for a second wiring. By irradiation with these pulses, the upper Al film is appropriately instantaneously melted and flows into the contact hole, and therefore, a good coverage with the Al film can be attained at the step portion and disconnection can be prevented.

Figure 1A:
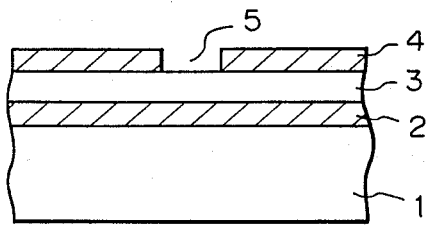
FIGS. 1a–1c are cross-sectional views illustrating a method for fabricating a semiconductor device according to one embodiment of the present invention.
Figure 1B:
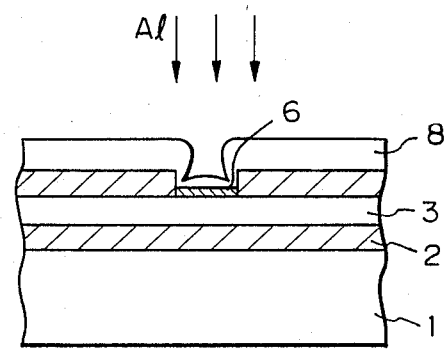
Figure 1C:
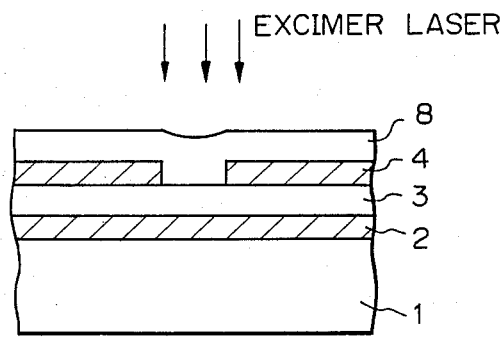
Figure 2A:
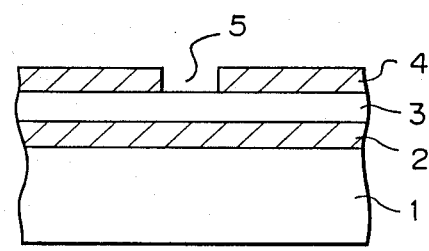
FIGS. 2a–2c are cross sectional views illustrating the conventional methods for fabricating a semiconductor device.
Figure 2B:
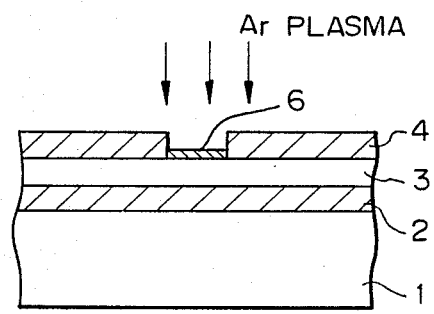
Figure 2C:
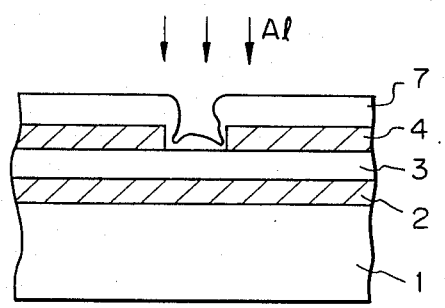

An embodiment of the present invention will now be described with reference to the accompanying drawings. FIGS. 1a through 1c are diagrams illustrating a method for fabricating a semiconductor device according to the embodiment of the present invention. The identical reference numerals as in FIGS. 2a–2c represent the same elements in FIGS. 1a–1c.

(1) Referring to FIG. 1a, an $SiO_2$ film 2 is formed on an Si substrate 1. Reference numeral 3 represents an Al film which is used as a first wiring, reference numeral 4 represents an $SiO_2$ film formed as an interlaminar insulating film on the Al film 3, and reference numeral 5 represents a contact hole.

(2) Then, as shown in FIG. 1b, an Al film 8 is layered onto the entire surface by, for example, the sputtering method. Since an oxide or adsorbed material 6 is formed on the surface of the Al film 3 exposed by formation of the contact hole, the contact between the Al films 8 and 3 is not always good. Furthermore, the coverage with the Al film 8 at the step portion of the insulating film 4 in the contact hole is not sufficient.

(3) Next, as shown in FIG. 1c, excimer laser beam pulses are applied to the Al film 8 from above the Al film 8. For example, ArF excimer laser beam (wavelength = 193 nm) can be used as the excimer laser beam, and the irradiation is carried out under conditions of an energy intensity of 10 $J/cm^2$ and a pulse width of 15 ns. If the energy intensity is lower than 3 $J/cm^2$, a substantial energy is not attained. In contrast, if the energy intensity is higher than 15 J/cm$^2$, the Al film 8 is damaged. Accordingly, preferably the energy intensity is 5 to 12 J/cm$^2$. Furthermore, if the pulse width is increased (for example, to 1 $\mu$s) or continuous waves are applied, the Al film 8 is damaged and good results can not be obtained. Other excimer laser beams can also be used. These include a KrF$_2$ excimer laser beam (wavelength =248 nm), A XeCl excimer laser beam (wavelength =308 nm) and A TEA-CO$_2$ laser beam (wavelength =106 nm). These laser beams would preferably have a pulse width of not larger than 100 ns.

Figure 3:
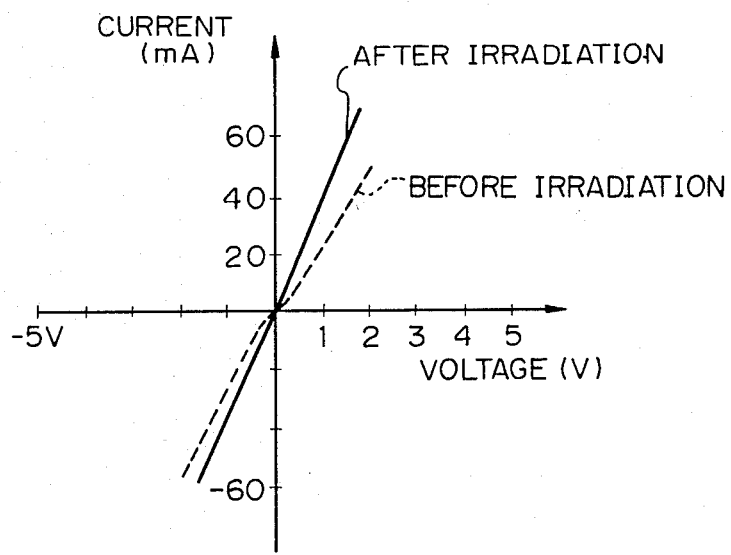
FIG. 3 is a diagram showing experimental data, which illustrates effects attained in the embodiment of the present invention FIGS. 1a–1c.

By this irradiation with A laser beam, a good ohmic contact can be obtained between the Al film 3 and Al film 8. This is illustrated in FIG. 3, which is a diagram showing experimental data. From FIG. 3, it is seen that, by irradiation with A laser beam, a good ohmic contact is obtained between the upper Al film 8 and the lower Al film 3.

Moreover, since by irradiaton with laser beam pulses the Al film 8 is appropriately melted without being damaged and the melt flows into the contact hole 5, the coverage with the Al film 8 at the step portion of the insulating film 4 is greatly improved.

As is apparent from the foregoing illustration, by irradiation with laser beam pulses, a good ohmic contact can be obtained in a plurality of wiring layers composed of an Al film without damaging the Al film. Accordingly, a semiconductor device having a high quality and a high integration degree can be provided.

Moreover, since the Al film is appropriately melted by irradiation with laser beam and the melt flows into the contact hole, the coverage with the Al film at the step portion can be improved and disconnection can be prevented.

I claim:

1. A method for fabricating a semiconductor device, which comprises:
    forming a contact hole in an insulating film formed on a first wiring composed of first Al film;
    covering the insulating film with a second Al film for a second wiring;
    applying laser beam pulses of an intensity and a pulse width to the Al second film for the second wiring from above so as to remove any oxide or adsorbed material formed on the first Al film to the first wiring, and
    patterning the second Al film to form the second wiring.

2. A method according to claim 1, wherein the Al films are each a film of aluminum or an aluminum alloy mainly composed of aluminum.

3. A method according to claim 1, wherein the laser beams pulses are excimer laser beams selected from an ArF excimer laser beam, a KrF$_2$ excimer laser beam, a XeCl excimer laser beam and a TEA-CO$_2$ laser beam.

4. A method according to claim 1, wherein the Al film for the second wiring is instantaneously melted and partially flows into the contact hole.

5. A method according to claim 1, wherein the predetermined pulse width is less than 15 nanoseconds.

6. A method according to claim 1, wherein the predetermined pulse width is less than 100 nanoseconds.

* * * * *

UNITED STATES PATENT AND TRADEMARK OFFICE
CERTIFICATE OF CORRECTION

PATENT NO. : 4,800,179

DATED : 1-24-89

INVENTOR(S) : Ryoichi Mukai

It is certified that error appears in the above-identified patent and that said Letters Patent is hereby corrected as shown below:

Col. 1, line 24 "$O_2$in" should be --$O_2$ in--.

Col. 2, line 17 after "invention" insert --of--.

Col. 3, line 1 "energy" (first occurrence) should be --effect--.

Col. 4, line 8 after "of" insert --a--.

Col. 4, line 14 "to" should be --for--.

Signed and Sealed this

Twenty-seventh Day of June, 1989

Attest:

DONALD J. QUIGG

*Attesting Officer*     *Commissioner of Patents and Trademarks*